United States Patent [19]

Rubin et al.

[11] Patent Number: 4,852,516
[45] Date of Patent: Aug. 1, 1989

[54] MODULAR PROCESSING APPARATUS FOR PROCESSING SEMICONDUCTOR WAFERS

[75] Inventors: Richard H. Rubin, Fairfield; Benjamin J. Petrone, Netcong, both of N.J.; Richard C. Heim, Mountain View, Calif.; Scott M. Pawenski, Wappingers Falls, N.Y.

[73] Assignee: Machine Technology, Inc., Parsippany, N.J.

[21] Appl. No.: 91,651

[22] Filed: Sep. 1, 1987

Related U.S. Application Data

[62] Division of Ser. No. 865,251, May 19, 1986, Pat. No. 4,722,298.

[51] Int. Cl.$^4$ ............................................. C23C 14/00
[52] U.S. Cl. ........................................ 118/715; 118/719; 134/61; 134/201; 219/385; 219/393; 219/482
[58] Field of Search ................. 118/719, 715; 134/61, 134/201; 219/385, 393, 482

[56] References Cited

U.S. PATENT DOCUMENTS

| | | | |
|---|---|---|---|
| 4,048,955 | 9/1977 | Anderson | 118/725 |
| 4,433,951 | 2/1984 | Koch | 414/217 |
| 4,592,306 | 6/1986 | Gallego | 118/719 |
| 4,681,773 | 7/1987 | Bean | 118/719 |

*Primary Examiner*—Richard Childs
*Attorney, Agent, or Firm*—Lerner, David, Littenberg, Krumholz & Mentlik

[57] ABSTRACT

A self-contained modular processing apparatus is disclosed for processing workpieces, and in particular, silicon wafers. The apparatus is constructed of framed modules which plug into a service facility docking subassembly and interlock therewith to make up a complete modular processing system for wafer processing. Each module may be provided with its own wafer transporting mechanism and includes a built-in CPU such that each module is an independent, stand-alone processing unit. Each processing unit, by being capable of independent operation, functions as a building block to configure a modular processing system capable of handling wafer flow in multiple directions while performing a multitude of processing functions or operations. Individual modules are arranged along a line of single fold symmetry such that a single transport mechanism may be employed for transferring wafers among adjacent modules.

23 Claims, 5 Drawing Sheets

MODULAR PROCESSING APPARATUS FOR PROCESSING SEMICONDUCTOR WAFERS

This is a division of application Ser. No. 865,251, filed 05/19/86 now U.S. Pat. No. 4,722,928.

BACKGROUND OF THE INVENTION

The present invention relates in general to a modular processing apparatus, and more particularly, to such an apparatus which is especially adapted for use in designing a modular processing system in connection with the manufacture of semiconductor devices from silicon wafers, for example, by permitting the plural arrangement of independent, self-contained processing modules in a plurality of track and/or branch configurations, each module being independently replaceable as a stand-alone unit with a module adapted to perform the same or different function or operation.

A key to profits in many fabrication processes is factory automation, i.e., removing people from the fabrication area for a host of cost/efficiency reasons which are familiar to every manager. In the manufacture of semiconductor devices, the manufacturing equipment has, in the past, been so complex and inflexible that automation has been difficult to achieve. More particularly, such equipment has been designed without branching or redundant capabilities, so that the entire production process is affected if one link in the process chain brakes. Also, there has been no capability in such prior processing equipment to add, subtract or change processing functions or operations simply and easily. Thus, the prior processing equipment used in the semiconductor manufacturing industry has been custom built for each particular process, which would normally include a series of sequenced processing steps. If the process is modified by, for instance, eliminating one step, an entirely new piece of equipment may be necessary in order to accommodate such a modification. In such a situation, the original piece of equipment could be obsolete, while the new piece of equipment could require large amounts of time and money to manufacture, thereby resulting in an extremely costly and time-consuming replacement procedure for the user.

SUMMARY OF THE INVENTION

The present invention overcomes many of the problems and disadvantages of the prior art processing equipment described above by providing a modular processing apparatus constructed of a chassis containing an integral processing module which is adapted to perform at least one preselected processing function or operation, such as coating, baking, scrubbing, deposition and the like. While the apparatus of the present invention provides an effective independent modular unit, it is specifically designed to be used as a "building block" in a plug in modular processing system. The apparatus, as a modular unit, may be configured into a modular processing system with other modular units, in any fashion, to satisfy the customer's needs. The resulting system is capable of handling silicon wafer flow in a multiple of directions, including parallel and branch tracks.

Each modular unit, via its chassis construction, is adapted to plug into a service facility docking subassembly and interlock therewith to make up a complete system for silicon wafer processing. Each modular unit can have its own wafer handler and CPU designed into the apparatus such that each modular unit is capable of being operated on its own or in combination with other modular units as a totally integrated system. Thus, in addition to a complete range of initial configurations, the user can quickly redefine processing functions by simply substituting alternate modular units. Also, replacement modular units can be inserted for a defective modular unit, thereby enabling the configured system to continue operation while the defective modular unit is being repaired. As a result of such design features, the apparatus of the present invention not only meets the user's present needs, but also provides a unique, flexible base for future expansion and change In accordance with one aspect of the present invention, there is disclosed a modular processing apparatus constructed of a chassis, a module attached to the chassis for performing at least one operation on a workpiece to be processed, a subassembly separate from the chassis, service supply means attached to the subassembly for supply a preselected service to the module for the operation thereof, and connection means for releasably connecting the service supply means to the module, whereby the module functions as an independent, self-contained processing unit.

In accordance with another aspect of the present invention, there is disclosed a modular processing apparatus constructed of a first chassis, a first module attached to the first chassis for performing at least one operation on a workpiece to be processed, a subassembly separate from the first chassis, the first chassis and the first module movable relative to the subassembly, and connection means for releasably connecting the first chassis and the first module as a unit to the subassembly, whereby a second chassis having a second module attached thereto can be connected to the subassembly as a unit in replacement of the first chassis and the first module.

In accordance with another aspect of the present, there is disclosed modular processing apparatus constructed of a chassis, a module attached to the chassis for performing at least one operation on a workpiece to be processed, a subassembly separate from the chassis, service supplying means attached to the subassembly for supplying a preselected service to the module for the operation thereof, service receiving means attached to the module for receiving the preselected service from the service supplying means, and connection means for releasably connecting the service supplying means to the service receiving means, whereby the module is operative in response to the supplying of the preselected service.

In accordance with another aspect of the present invention, there is disclosed a modular processing apparatus constructed of a chassis having a module attached thereto for performing at least one operation on a workpiece to be processed, transfer means attached to the chassis for transferring the workpiece from the module to a location remote therefrom for performing at least another operation on the workpiece, the distance between the module and the transfer means being equal to the distance between the transfer means and the location.

In accordance with another aspect of the present invention, there is disclosed a modular processing apparatus constructed of a first chassis having a first module attached thereto, the first module for performing at least one operation on a workpiece to be processed, a second chassis having a second module attached thereto, the second module for performing at least one operation on the workpiece to be processed, and transfer means attached to one of the first or second chassis for transferring the workpiece between the first module and the second module, the distance between the first module and the transfer means being equal to the distance between the transfer means and the second module.

In accordance with another aspect of the present invention, there is disclosed a modular processing apparatus constructed of a first chassis having a pair of first diagonal axes, a first module attached to the first chassis and arranged symmetrical about one of the first diagonal axes, a second chassis having a pair of diagonal axes, a second module attached to the second chassis and arranged symmetrical about one of the second diagonal axes, and transfer means attached to one of the first or second chassis along the diagonal axis about which the corresponding first or second module is symmetrically arranged, the transfer means transferring the workpiece between the first module and the second module.

BRIEF DESCRIPTION OF THE DRAWINGS

The above description, as well as further objects, features and advantages of the present invention, will be more fully understood by reference to the following detailed description of a presently preferred, but nonetheless illustrative, modular processing apparatus for processing silicon wafers, in accordance with the present invention, when taken in conjunction with the accompanying drawings, wherein.

DETAILED DESCRIPTION

Figure 1:
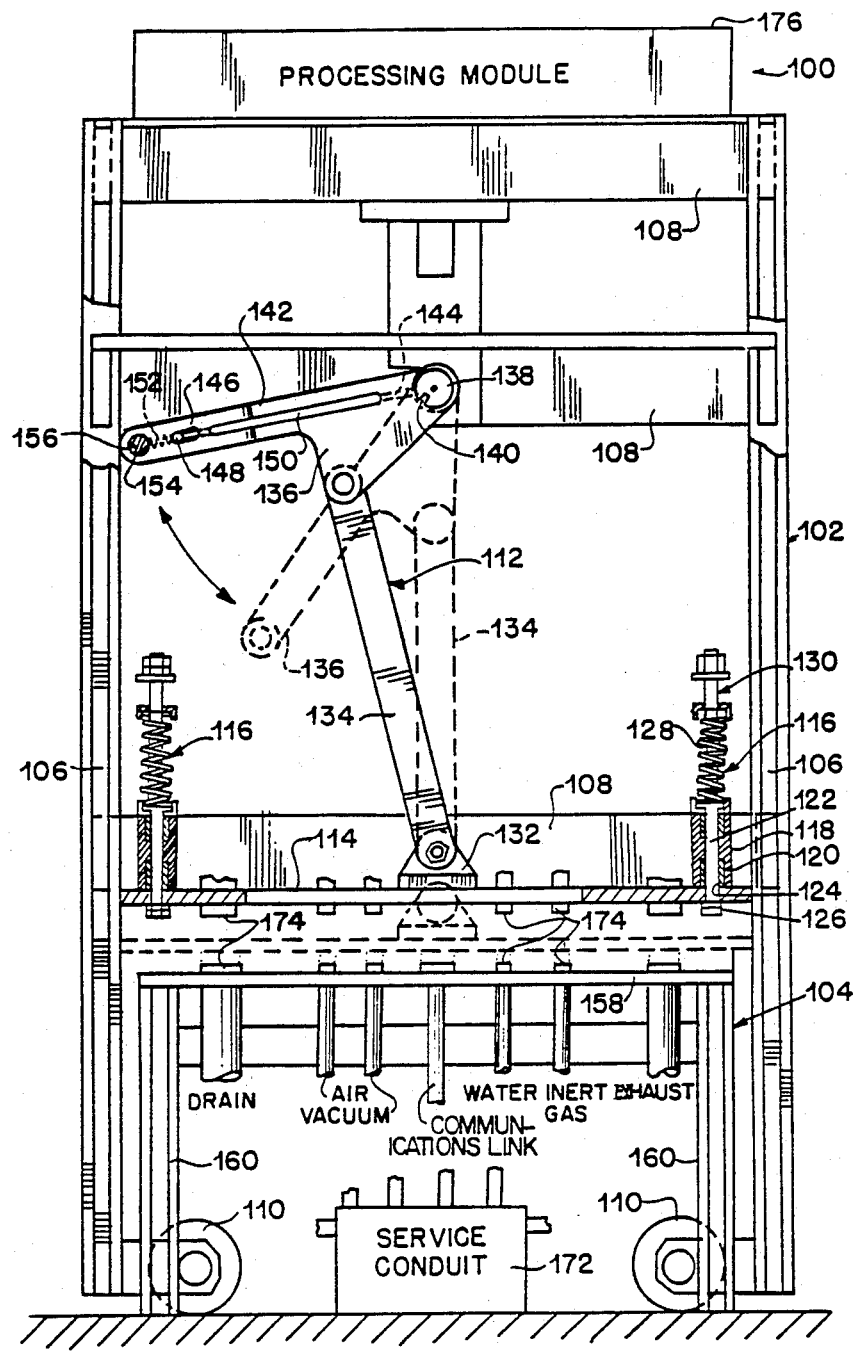
FIG. 1 is a front elevational view, having a portion thereof removed, showing the modular processing apparatus connected to a service facility docking subassembly by means of a pair of spaced-apart interconnected lever assemblies.
Figure 2:
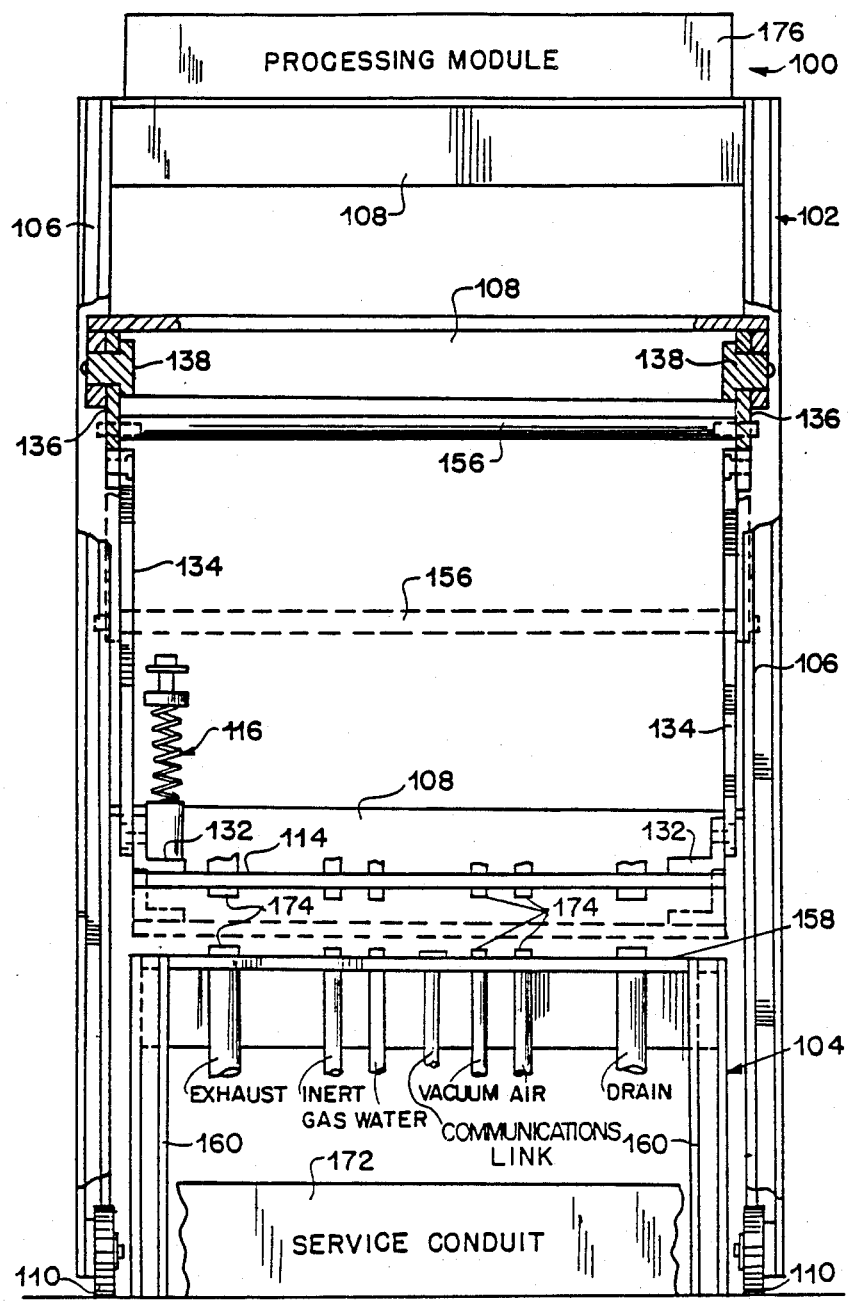
FIG. 2 is a side elevational view, having a portion thereof removed, showing in further detail the chassis construction of the modular processing apparatus of the present invention.
Figure 3:
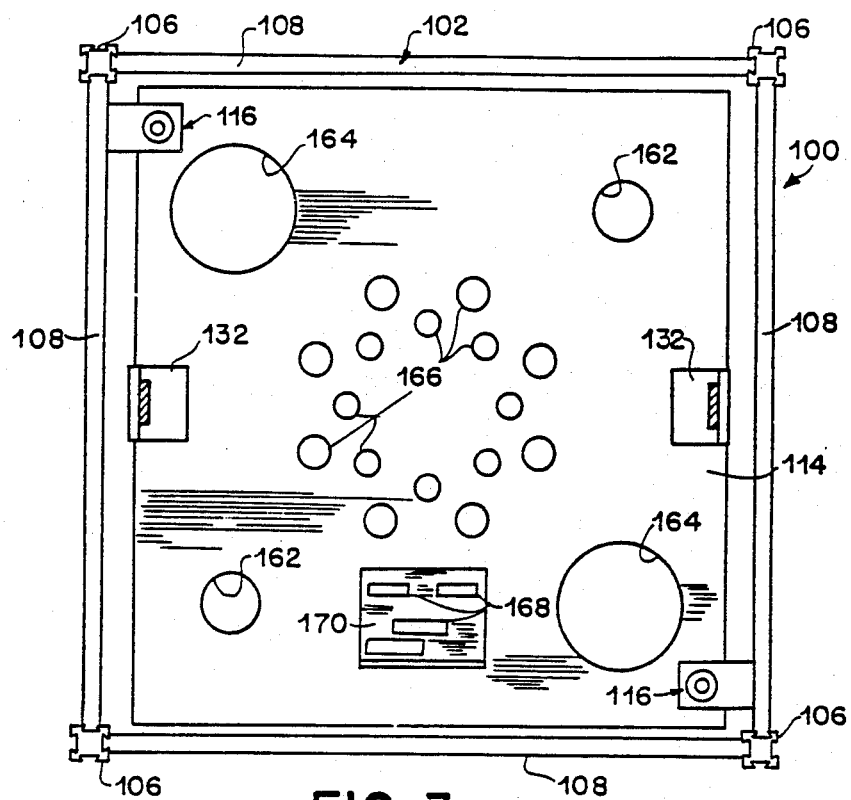
FIG. 3 is a top plan view taken along Line 3-3 in FIG. 1, showing the construction and arrangement of a service facility chassis docking plate for the processing modular provided within the chassis of the apparatus.

Referring now to the drawings, wherein like reference numerals represent like elements, there is shown in FIGS. 1-3 the construction and arrangement of a modular processing apparatus in accordance with the present invention, and designated generally by reference numeral 100. The apparatus 100 is constructed of a chassis 102 releasably connectable to an underlying service facility docking subassembly 104. The chassis 102 is constructed of four longitudinally extending corner posts 106 having a dove tail construction, as shown in FIG. 3. The corner posts 106 are secured to one another in spaced-apart relationship to provide the chassis 102 with a square cross-section by means of a plurality of side stringers 108 of equal length. The side stringers 108 are secured to the corner posts 106 by having a dove tail arrangement which mates and interlocks with the dove tail construction of the corner posts. The chassis 102 is rendered movable along the underlying floor by providing a caster 110 attached to the lower end of each corner post 106. As thus far described, the chassis 102 is of self-supporting, rigid construction and adapted for transport by means of the casters 110.

Internally attached to the chassis 102 is a combination of a pair of spaced-apart lever assemblies 112 and a horizontally arranged service facility chassis docking plate 114. The chassis docking plate 114 is movably supported between the corner posts 106 by means of a pair of diagonally opposed support assemblies 116. Each support assembly 116 is constructed of a bushing block 118 secured to a side stringer 108 and having a longitudinally extending bore 120 adapted to slidingly receive an elongated support pin 122. The lower end of the support pin 122 extends through an opening 124 in the chassis docking plate 114 and is retained thereat by means of double nut arrangement 126. A bias spring 128 is positioned around an upper portion of the support pin between the bushing block 118 and a stop arrangement 130 secured to a portion of the support pin. In accordance With the construction of the support assemblies 116, the chassis docking plate 114 is normally biased in an upward direction between the confines of the corner posts 106.

Figure 4:
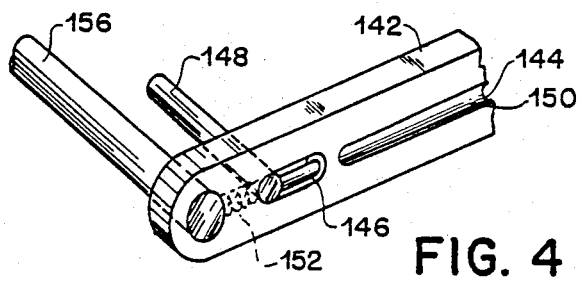
FIG. 4 is a perspective view showing in greater detail a portion of the lever assembly, and in particular, its locking and unlocking mechanism.

Each lever assembly 112 is constructed of an L-shaped foot 132 attached adjacent one side of the chassis docking plate 114. A longitudinally extending lever arm 134 is pivoted at one end to the foot 132 and at its other end to a depending portion of a control lever 136. The control lever 136 is journaled to a bearing 138 attached to the chassis 102 and has a radial opening 140 extending inwardly from its outer surface at an angular orientation displaced from a vertical axis. The axis of rotation of the control lever 136 about the bearing 138 is arranged in alignment with a vertical axis extending through the pivot point of the lever arm 134 at the foot 132. The control lever 136 is provided with an extending portion 142 having a central axial bore 144 extending between a slotted opening 146 and the bearing 138. 30 As more clearly shown in FIG. 4, a short control rod 148 is transversely arranged to the control lever 136 and is movably captured within the slotted opening 144. An elongated locking pin 150 is slidingly received within the bore 144 having one end arranged adjacent the bearing 138 and its other end attached to that portion of the control rod 148 captured within the slotted opening 146. The control rod 148, and thus the locking pin 150, is normally biased to the right, as shown in FIG. 1, by means of a compression spring 152. As a result of this arrangement, the free end of the locking pin 150 is engaged upon the outer circumferential surface of the bearing 138. The distal end of the control lever 136 is provided with an opening 154 for securing a transversely extending lever rod 156 which is secured at its other end Within a similar opening within the distal portion of the control lever of the corresponding opposing lever assembly 112. Thus, the lever assemblies 112 are interconnected by means of the lever rod 156 to permit unified and simultaneous operation thereof.

The lever assemblies 112 function to raise and lower the chassis docking plate 114 to provide interconnection with service facilities extending from the docking subassembly 104 as to be described hereinafter. The chassis docking plate 114 is normally biased in its upper position by means of the support assemblies 116, as shown. Lowering of the chassis docking plate 114 from its upper position to its lower position, as shown in phantom in FIGS. 1 and 2, is accomplished by rotation of the lever rod 156 in a counterclockwise direction as viewed in FIG. 1. The rotation of the lever rod 156 causes simultaneous and synchronized rotation of the control levers 136 about their corresponding bearings 138. During this counterclockwise rotation of the control levers 136, the lever arms 134 are pivoted about their corresponding foot 132 in a clockwise direction until achieving a substantially vertical orientation, as shown in phantom in FIG. 1. As the lever arms 134 are pivoted, the chassis docking plate 114 is urged downwardly in response to the effective lengthening of the lever arms due to the downward counterclockwise rotation of the control levers 136. Once the chassis docking plate 114 has achieved its lowermost position, the lever arms 134 are arranged having their longitudinal axes in alignment with a vertical axis extending through the center of rotation of the control levers 136 about their corresponding bearings 138. The chassis docking plate 114 is locked in its lowermost position by the free end of the locking pin 150 being captured within the opening 140 within the bearing 138. The locking pin 150 is urged into engagement with the radial opening 140 by operation of the compression spring 152 as the bore 144 within the control lever 136 is brought into registration therewith As the locking pin 150 is urged into the radial opening 140, the control rod 148 is urged longitudinally along the slotted opening 146 by force of the compression spring 152.

To raise the chassis docking plate 114, it is first required to disengage the locking pin 150 from the radial opening 140 within the bearing 138. This is accomplished by manually engaging that portion of the control rod 148 extending outwardly from the control lever 136 and displacing it along the slotted opening 146 and away from the radial opening 140 within the bearing 138. As the locking pin 150 is attached to the control rod 148, the locking pin is withdrawn from the radial opening 140, thereby allowing clockwise rotation of the control levers 136 about their corresponding bearings 138 by means of the lever rod 156. This rotation of the control rods 136 will return the chassis docking plate 114 to its original upper position.

The apparatus 100 is easily movable from a remote location to one overlying the stationary service facility docking subassembly 104. As shown, the docking subassembly 104 is received between the lower portions of the corner posts 106 of the chassis 102 and underlying the chassis docking plate 114. The docking subassembly 104 is constructed of a subassembly docking plate 158 supported in a horizontal position by four dove tail corner posts 160. The subassembly docking plate 158 and chassis docking plate 114 are similarly constructed to include a plurality of corresponding aligned openings for receiving and retaining the connection of a plurality of service facilities. Specifically, as shown in FIG. 3, these openings include a pair of diagonally opposed drain openings 162, a pair of diagonally opposed exhaust openings 164, plurality of miscellaneous service facility openings 166 arranged along the circumference of a pair of imaginary concentric circles, and a plurality of electrical openings 168 arranged on a hinged plate 70 The miscellaneous service facility openings 166 provide connection for such service facilities as vacuum, air, fluids and the like. On the other hand, the electric openings 168 provide for such service facilities as 110 volts AC, 220 volts AC, 24 volts DC, communication links and the like.

The designated service facilities are provided from a remote location and received within a common service conduit 172 positioned underlying the service facility docking subassembly 104. The service facility openings, such as openings 160, 162, 164, 166, 168 in the chassis docking plate 114 and subassembly docking plate 158 are provided with a suitable connector 174 for receiving a corresponding one of a plurality of service facilities extending through the service conduit 172. The connectors 174 are constructed in the nature of standard connectors such as quick connect/disconnect connectors, standard power cord connectors, standard ribbon cable connectors and the like. Thus, any number and type of service facilities may be supplied to the apparatus 100 from a remote location by means of the service conduit 172 arranged underlying the stationary service facility docking subassembly 104.

The layout of the service facility openings within the chassis docking plate 114 and subassembly docking plate 158 is arranged to permit their registration, irrespective of the angular orientation of the apparatus 100 to the docking subassembly 104. That is, the apparatus 100 may be connected to the docking subassembly 104 in any one of four orientations by rotation of the chassis 102 through 90 segments. The particular angular orientation of the apparatus 100 with respect to the docking subassembly 104 is governed by the desired direction of process flow. The service facilities being connected to the service facility openings of the subassembly docking plate 158 are so arranged to correspond and mate with the service facilities of the apparatus 100 at its designated angular orientation with respect to the docking subassembly 104.

Each apparatus 100 is provided with at least one processing module 176 adapted to perform at least one processing function or operation on a Workpiece such as a silicon wafer. The processing module 176 may be adapted to perform any one of a variety of dedicated functions or operations such as coating, deposition, baking, developing, scrubbing, buffering, inspection, plasma etching, ultraviolet light exposure, elevator storage, transporting and the like. These processing modules 176 are standard equipment known in the semiconductor processing industry and will accordingly not be described hereat. The service facilities required for operation of a dedicated processing module 176 are supplied thereto by means of the connectors 174 secured within the service facility openings within the chassis docking plate 114. Thus, each apparatus 100 having a processing module 176, comprises an independent, self-contained processing modular unit adapted to perform a specified dedicated function or operation on the silicon wafer being processed. Each processing module 176 will further include its own CPU and additional distributive processing capability such that the apparatus 100 can be operated as a stand-alone processing modular unit or connected with other processing modules to configure a modular processing system therefrom. To this end, the apparatus 100 is positioned over the docking subassembly 104 and secured thereto by operation of the lever assemblies 112, which simultaneously interconnects all service facilities by engagement of the connectors 174 on the chassis docking plate 114 with those on the subassembly docking plate 158.

Figure 5:
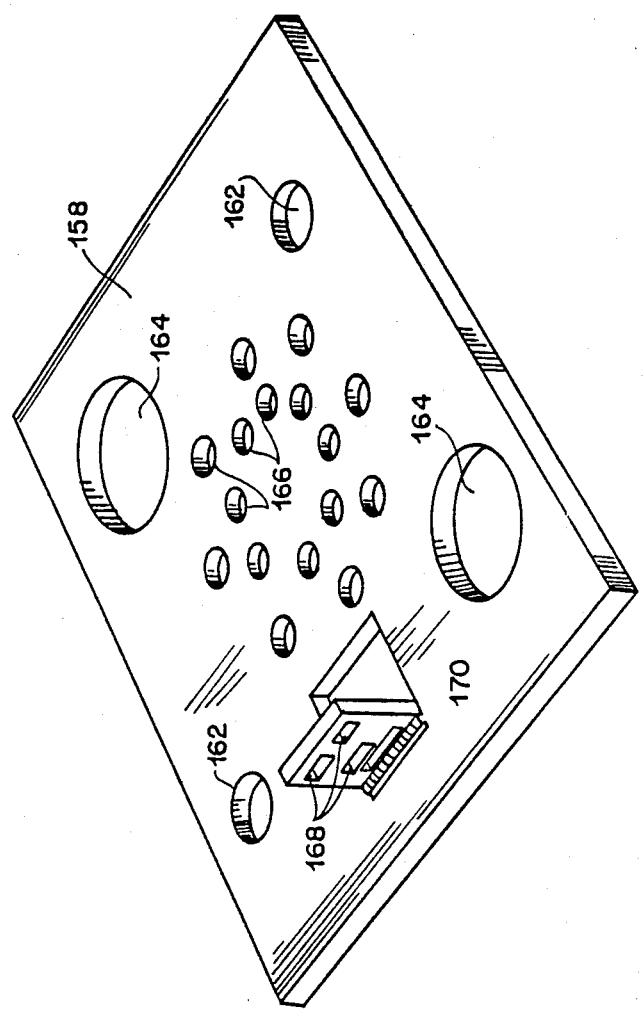
FIG. 5 is a perspective view of a docking plate of the service facility docking subassembly, and showing a hinged portion thereof adapted for providing electrical connection with the processing module.

In connecting the service facilities, in particular the electrical facilities, it is preferred that the electrical openings 168 be normally maintained in a vertical position to prevent potential shorting by fluids which may be present. As shown in FIG. 5, the electrical openings 168 are provided within a hinged plate 170 normally biased into a vertical orientation. As the chassis 102 of the apparatus 100 is moved across the subassembly docking plate 158, a portion of the chassis engages the hinged plate 178 causing its rotation into a horizontal orientation At such time, connection to the electrical service facilities may be made by means of the connectors 174, as previously described.

Figure 6:
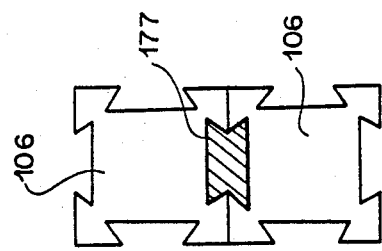
FIG. 6 is a top plan view of a portion of the chassis of the modular processing apparatus, and showing the interconnection of one chassis to an adjacent chassis by means of an interlocking dove tail strip.
Figure 7:
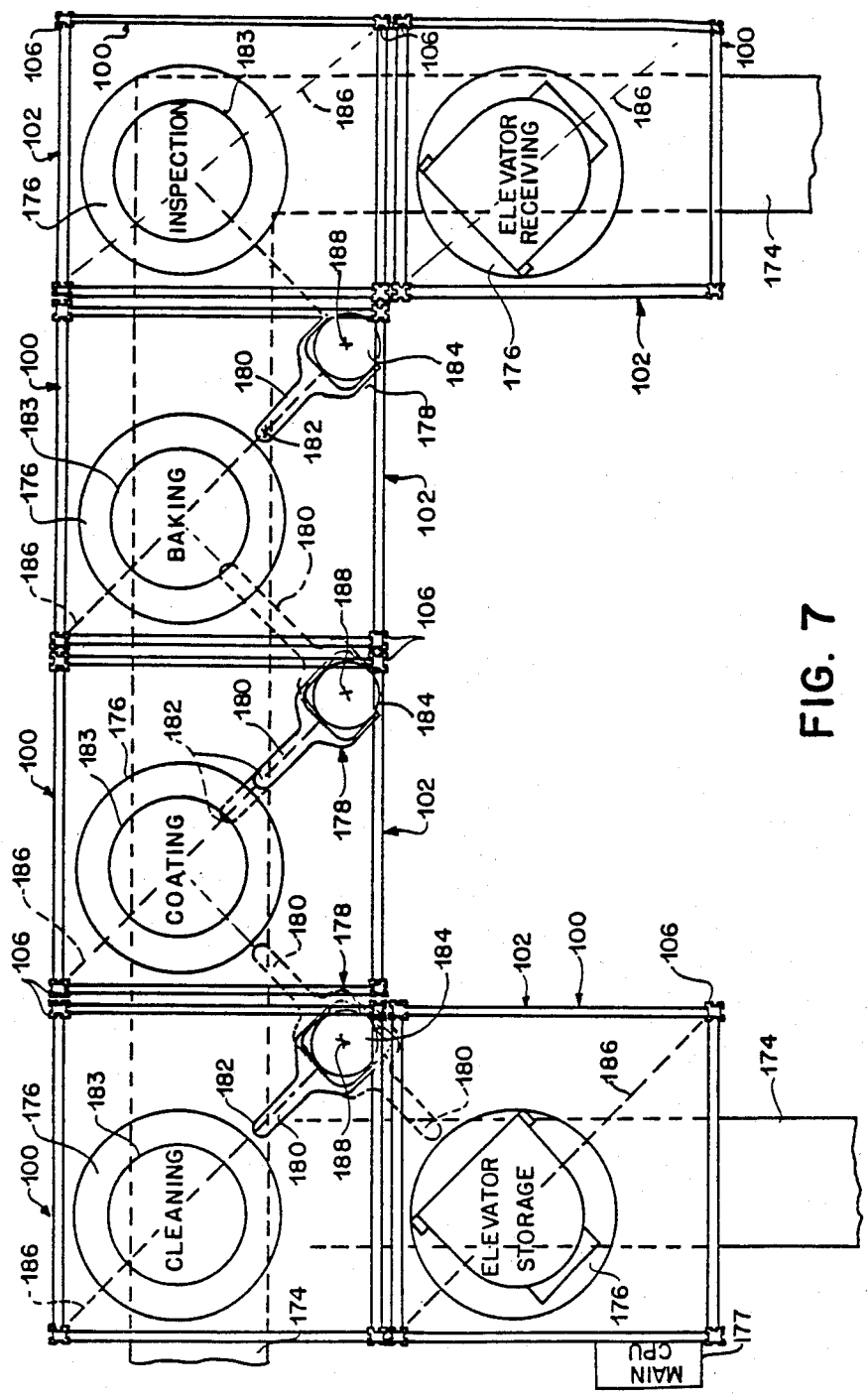
FIG. 7 is a block diagrammatic illustration showing the modular processing apparatus configured into a track and branched modular processing system for processing silicon wafers by individual, stand-alone self-contained modular units.

Referring now to FIG. 7, a plurality of modular processing apparatuses 100, each containing a processing module 176, are configured to provide a modular processing system adapted to perform a number of processing operations on a silicon wafer being transferred along a track having multiple branches. For example, a U-shaped configuration of a modular processing system is shown beginning with a modular elevator storage apparatus, continuing to a cleaning modular apparatus, a coating modular apparatus, a bake modular apparatus, an inspection modular apparatus, and finally to an elevator receiving modular apparatus. Each apparatus 100 is independent of its neighboring apparatus and functions as a stand-alone, self-contained building block. Each modular processing apparatus 100 is releasably secured to an adjacent apparatus by use of a dove tail strip 177 received within the dove tail construction of the corner posts 106, as shown in FIG. 6. Thus, each apparatus 100 may be replaced by one performing the same function or operation in the event of failure, or with one performing a different function or operation in order to reconfigure the modular processing system to redefine the processing functions.

The modular processing system further includes a main CPU 177 which is programmed to control the sequence of silicon wafer handling and transport. The main CPU 177 performs the primary programmed operation of controlling the modular processing system as a system. In addition, as previously described, each process module 176 includes its own CPU and addition distributing process capabilities. As such, each processing module 176 is provided with a communications link which is connected to an adjacent processing module to establish control communication therebetween, as well as to the main CPU 177. The communications link, is attached to one of the electrical openings 178. The communications link between the processing modules 176 sets up the proper time sequences for the operation of the individual processing modules under control of the main CPU 177 by, for example, signaling the adjacent processing module that the designated function or operation being performed has been completed. The particular programming for the operation of a particular modular processing system is not within the scope of the present invention and, in any event, can be provided using conventional programming techniques once the desired sequences and functions or operations of the modular processing system have been established.

In accordance with another aspect of the present invention, as further shown in FIG. 7, certain ones of the modular processing apparatus 100 are provided with a wafer transporting mechanism 178. The transporting mechanism 178 is constructed generally of an extendable arm 180, for example, one that is constructed to include a plurality of telescopic members having its free end 182 configured for releasably engaging silicon wafers 183 and its other end attached to an indexing or rotating mechanism 184. The specific construction of such a transporting mechanism 178 is generally known in the semiconductor industry, and will therefore not be described further. The transporting mechanism 178 is uniquely located along a diagonal of the chassis 102 which extends between a pair of opposing corner posts 106. The diagonal is designated by dotted line 186. Each processing module 176 is positioned diagonally opposite the transporting mechanism 178 and symmetrical only about the diagonal 186. Thus, the processing module 176 being symmetrical only about the diagonal 186, results in single fold symmetry about the hypotenuse of the chassis 102, i.e., the diagonal.

As further shown, the operative center of the transporting mechanism 178 designated as location 188, is equally distant between the centers of neighboring processing modules 176 contained within adjacent modular processing apparatuses 100. This arrangement permits a single transporting mechanism 178 to have the operative capability of transferring a silicon wafer between adjacent processing modules 176. The arrangement is particularly advantageous when the modular processing apparatus 100 containing the transporting mechanism 178 is arranged in the corner of the modular processing system. As shown, the cleaning processing module includes a transporting mechanism 178 which is adapted for transporting silicon wafers from the adjacent elevator storage processing module to the cleaning module, and then to the adjacent coating processing module. This is achieved by extending arm 180 so as to engage a silicon wafer and indexing or rotating the arm by means of the rotating mechanism 184 until the wafer overlies the central portion of the adjacent processing module, as shown generally in phantom. The arm 180 is retracted during transfer of the wafer between processing modules 176

Although the invention herein has been described with reference to particular embodiments, it is to be understood that these embodiments are merely illustrative of the principles and application of the present invention. For example, the modular processing apparatus 100 has been particularly described as having utility in the processing of silicon wafers in the fabrication of semiconductor devices. However, the apparatus 100 may be used with equal utility, resulting in the same advantages and beneficial results in configuring a modular processing system for handling masks, hard disks, disc covers and the like. It is therefore to be understood that numerous modifications may be made to the embodiments and that other arrangements may be derived without departing from the spirit and scope of the present invention as defined by the appended claims.

What is claimed is:

1. A modular processing apparatus comprising a chassis, a module attached to said chassis for performing at least one operation on a workpiece to be processed, a subassembly separate from said chassis, service supply means attached to said subassembly for supplying a preselected service to said module for the operation thereof, and connection means for releasably connecting said service supply means to said module, whereby said module functions as an independent, self-contained processing unit.

2. A modular processing apparatus comprising a first chassis, a first module attached to said first chassis for performing at least one operation on a workpiece to be processed, a subassembly separate from said first chassis, said first chassis and said first module movable relative to said subassembly, and connection means for releasably connecting said first chassis and said first module as a unit to said subassembly, whereby a second chassis having a second module attached thereto can be connected to said subassembly as a unit in replacement of said first chassis and said first module.

3. A modular processing apparatus comprising a chassis, a module attached to said chassis for performing at least one operation on a workpiece to be processed, a subassembly separate from said chassis, service supplying means attached to said subassembly for supplying a preselected service to said module for the operation thereof, service receiving means attached to said module for receiving said preselected service from said service supplying means, and connection means for releasably connecting said service supplying means to said service receiving means, whereby said module is operative in response to the supplying of said preselected service.

4. The modular processing apparatus of claim 1, wherein said chassis comprises a first frame assembly supporting said module and said connection means, said first frame assembly having a lower portion constructed for receiving said subassembly underlying said connection means.

5. The modular processing apparatus of claim 4, wherein said connection means is movably arranged within said first frame assembly between a service supply connecting position, whereby said first frame assembly is secured to said subassembly, and a service disengaging position, whereby said first frame assembly is movable relative to said subassembly.

6. The modular processing apparatus of claim 5, wherein said connection means includes a plurality of service supply connectors individually matable with a corresponding one of a plurality of said service supply means, whereby a plurality of said preselected services are simultaneously coupled to said module when said connection means is brought into said service supply connecting position.

7. The modular processing apparatus of claim 4, wherein said subassembly comprises a second frame assembly having a subassembly docking plate supporting said service supplying means, said first frame assembly having a chassis docking plate couplable with said subassembly docking plate by operation of said connection means.

8. The modular processing apparatus of claim 7, wherein said connection means includes a lever assembly operative for moving said chassis docking plate between a position coupled to said subassembly docking plate and a position disengaging therefrom.

9. The modular processing apparatus of claim 8, further including means for biasing said chassis docking plate into a position disengaged from said subassembly docking plate.

10. The modular processing apparatus of claim 2, further including service supply means attached to said subassembly for supplying a preselected service to said first module and said second module upon its corresponding chassis being connected to said subassembly by said connection means.

11. The modular processing apparatus of claim 10 further including another one of said subassemblies having service supplying means attached thereto, said first chassis and said second chassis connected to a corresponding one of said subassemblies for operation of said first and second modules.

12. The modular processing apparatus of claim 11, wherein said first chassis comprises a first frame assembly and said second chassis comprises a second frame assembly, said first frame assembly and said second frame assembly having a lower portion constructed for receiving one of said subassemblies underlying said connection means.

13. The modular processing apparatus of claim 12, further including means for releasably locking said first frame assembly to said second frame assembly.

14. The modular processing apparatus of claim 10, wherein said connection means is movably arranged within said first frame assembly between a service supply connecting position, whereby said first frame assembly is secured to said subassembly, and a service supply disengaging position, whereby said first frame assembly is movable relative to said subassembly.

15. The modular processing apparatus of claim 14, wherein said service supplying means comprises a drain, exhaust, gas, vacuum and liquid service.

16. The modular processing apparatus of claim 14, wherein said subassembly and said first chassis include a plurality of service supply connectors, matable with each other, for supplying a plurality of said preselected services to said first and second modules upon being connected to said subassembly by said connection means.

17. The modular processing apparatus of claim 3, wherein said chassis comprises a first frame assembly supporting said module and said connection means, said frame assembly having a lower portion constructed for receiving said subassembly underlying said connection means.

18. The modular processing apparatus of claim 17, wherein said connection means is movably arranged within said first frame assembly between a service supply connecting position, whereby said first frame assembly is secured to said subassembly, and a service supply disengaging position, whereby said first frame assembly is movable relative to said subassembly.

19. The modular processing apparatus of claim 18, wherein said subassembly comprises a second frame assembly having a subassembly docking plate supporting said service supplying means, said first frame assembly having a chassis docking plate couplable with said subassembly docking plate by operation of said connection means.

20. The modular processing apparatus of claim 19, wherein said connection means includes a lever assembly operative for moving said chassis docking plate between a position coupled to said subassembly docking plate and a position disengaging therefrom.

21. The modular processing apparatus of claim 3, further including a plurality of said chassis each having a module attached thereto, each said chassis connectable to said subassembly.

22. The modular processing apparatus of claim 21, further including a plurality of subassemblies each having said service supplying means attached thereto, said subassemblies connectable to one of said plurality of said chassis for coupling said preselected service thereto.

23. The modular processing apparatus of claim 3, wherein said service supplying means comprises exhaust, gas, vacuum, and liquid service.

* * * * *

UNITED STATES PATENT AND TRADEMARK OFFICE
CERTIFICATE OF CORRECTION

PATENT NO. : 4,852,516

DATED : August 1, 1989

INVENTOR(S) : Richard H. Rubin; Benjamin J. Petrone; Richard C. Heim

It is certified that error appears in the above-identified patent and that said Letters Patent is hereby corrected as shown below:

Column 3, line 65, "!-3" should read --1-3--.
Column 4, line 5, "!06" should read --106--.
Column 4, line 51, "30" should be deleted.
Column 6, line 5, "70" should read --170--.
Column 6, line 36, "90" should read --90°--.
Column 9, line 37, after "service" insert --supply--.

Signed and Sealed this

Twelfth Day of June, 1990

Attest:

HARRY F. MANBECK, JR.

*Attesting Officer*     *Commissioner of Patents and Trademarks*